(12) United States Patent
Camacho et al.

(10) Patent No.: US 8,633,578 B2
(45) Date of Patent: Jan. 21, 2014

(54) INTEGRATED CIRCUIT PACKAGE SYSTEM WITH LAMINATE BASE

(75) Inventors: Zigmund Ramirez Camacho, Singapore (SG); Henry D. Bathan, Singapore (SG); Arnel Trasporto, Singapore (SG); Jeffrey D. Punzalan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 14 days.

(21) Appl. No.: 13/196,279

(22) Filed: Aug. 2, 2011

(65) Prior Publication Data
US 2011/0284842 A1 Nov. 24, 2011

Related U.S. Application Data

(62) Division of application No. 11/459,325, filed on Jul. 21, 2006, now Pat. No. 7,993,939.

(51) Int. Cl.
*H01L 23/02* (2006.01)
(52) U.S. Cl.
USPC .................. 257/686; 257/777; 257/E23.123; 257/E25.013

(58) Field of Classification Search
USPC .................................. 257/E23.123, E25.013
See application file for complete search history.

(56) References Cited

U.S. PATENT DOCUMENTS

| | | | |
|---|---|---|---|
| 6,251,695 B1 | 6/2001 | Kwon | |
| 6,607,937 B1 * | 8/2003 | Corisis | 438/108 |
| 6,853,064 B2 | 2/2005 | Bolken et al. | |
| 6,933,598 B2 | 8/2005 | Karnezos | |
| 6,946,323 B1 | 9/2005 | Heo | |
| 6,967,395 B1 | 11/2005 | Glenn et al. | |
| 6,972,481 B2 | 12/2005 | Karnezos | |
| 7,859,120 B2 | 12/2010 | Choi et al. | |
| 2004/0227250 A1 * | 11/2004 | Bolken et al. | 257/777 |
| 2005/0167810 A1 | 8/2005 | Bai et al. | |
| 2006/0220257 A1 * | 10/2006 | Lee | 257/777 |
| 2007/0194424 A1 | 8/2007 | Camacho et al. | |

\* cited by examiner

*Primary Examiner* — Daniel Whalen
(74) *Attorney, Agent, or Firm* — Ishimaru & Associates LLP

(57) ABSTRACT

An integrated circuit package system with laminate base includes: a base package including: a laminate substrate strip, an integrated circuit on the laminate substrate strip, a molded cover over the integrated circuit and the laminate substrate strip, and a strip test of the base package; a bare die on the base package; the bare die electrically connected to the laminate substrate strip; and the bare die and the base package encapsulated.

9 Claims, 4 Drawing Sheets

INTEGRATED CIRCUIT PACKAGE SYSTEM WITH LAMINATE BASE

CROSS-REFERENCE TO RELATED APPLICATION(S)

This is a divisional of U.S. patent application Ser. No. 11/459,325 filed Jul. 21, 2006, now U.S. Pat. No. 7,993,939.

TECHNICAL FIELD

The present invention relates generally to integrated circuit package systems, and more particularly to a system for package-in-package design and manufacture.

BACKGROUND ART

Semiconductors, or computer chips, have made their way into virtually every electrical product manufactured today. Chips are used not only in very sophisticated industrial and commercial electronic equipment, but also in many household and consumer items such as televisions, clothes washers and dryers, radios and telephones. As many of these types of products become smaller but more functional, there is a need to include more chips in these smaller products. The reduction in size of cellular telephones is one example of how more and more capabilities find their way into smaller and smaller electronic products.

The popularity of smaller and more complicated electronic products has placed increased demands on the packaging for chips used in such devices. These increased demands have led to new chip packaging concepts and approaches. Unpackaged chips are referred to as die or dies, and current packaging methods include placing more than one die in a single package. One such approach is to stack one die on top of another and then enclose the stack of dies in one package. The final package for the multiple-stacked semiconductor dies is much smaller than would result if the dies were each packaged separately. In addition to providing a smaller size, these packages offer a number of aspects that relate to the manufacturing of the package such as ease of handling and assembling.

An example of a die stacking technique incorporates a pair of stacked dies encapsulated in a molded plastic package that has connectors or leads extending out from the package which function as input/output terminals of the die inside the package. The package includes a substrate and a first die mounted on the top surface of the substrate. A second die is then stacked on top of the first die.

The substrate may be comprised of a flexible resin tape, a rigid fiber-glass/copper sheet laminate, a co-fired ceramic coupon, a flexible metal lead frame, a ball grid array substrate, or other well-known types of substrates in the semiconductor industry, depending on the particular type of semiconductor package being used.

The first die is conventionally mounted to the top surface of the substrate with, for example, a layer of an adhesive or an adhesive film, and then electrically connected to the substrate by a plurality of fine, conductive wires, typically gold (Au) or aluminum (Al). The wires are attached to the die at the bonding pads, which are located around the periphery of the die.

The second die is mounted on the top surface of the first die with an adhesive layer that is positioned within the central area of the top surface of the first die. The adhesive layer may contact or cover both the bonding pads of the first die and the conductive wires bonded to the first die. The adhesive layer positions the second die sufficiently far above the first die to prevent the dies from contacting each other or any wires connected to the dies. The second die is then wire bonded to the substrate in the same fashion as the first die. One or more additional dies can then be stacked on top of the second die using the same technique.

After the dies are wire bonded to the substrate, the dies, substrate, and conductive wires are covered with plastic, or other suitable material, which encapsulates the stacked dies and protects them from moisture and other environmental elements.

Despite efforts to overcome problems resulting in lower yields of semiconductor packages with stacked dies problems still exist. In particular, dies within the stack fail prematurely or are detected as being bad only after assembly.

Thus, a need still remains for a method of device stacking that allows improved yields and results in lower height packages. In view of the demand for increased volume and smaller packages, it is increasingly critical that answers be found to these problems. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system with laminate base including: a base package including: a laminate substrate strip, an integrated circuit on the laminate substrate strip, a molded cover over the integrated circuit and the laminate substrate strip, and a strip test of the base package; a bare die on the base package; the bare die electrically connected to the laminate substrate strip; and the bare die and the base package encapsulated.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
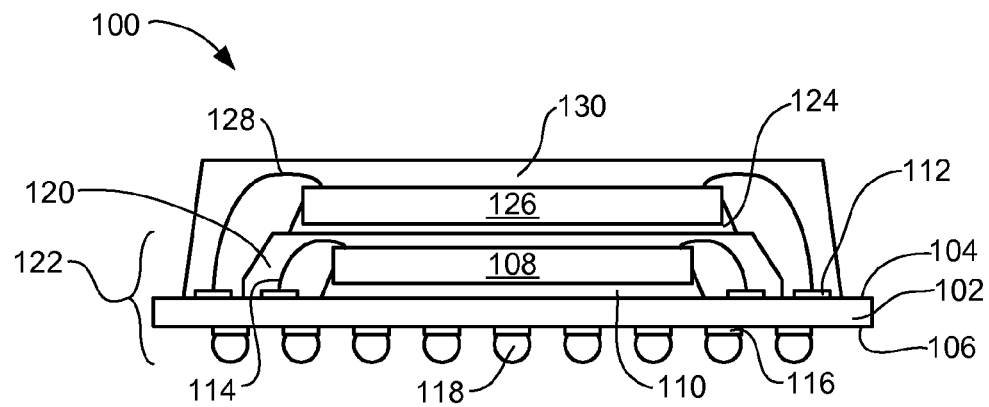
FIG. 1 is a cross-sectional view of an integrated circuit package system with laminate base, in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact between the elements. The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system with laminate base 100, in an embodiment of the present invention. The cross-sectional view includes a substrate 102, such as a laminate substrate or ceramic substrate, having a top surface 104 and a bottom surface 106. An integrated circuit 108 is attached to the top surface 104 with an adhesive 110, such as a die attach material which may be of a conductive or a non-conductive type. Bond pads 112, configured in an inner row and an outer row, are on the top surface 104 proximate the integrated circuit 108 and are electrically connected by first bond wires 114. The inner row is closer to the integrated circuit 108 than the outer row. A substrate contact 116 is formed on the bottom surface 106 of the substrate 102. System interconnects 118, such as solder balls, solder columns or stud bumps, are attached to the substrate contact 116. A first molding compound 120 encapsulates the integrated circuit 108, the first bond wires 114, the inner row of the bond pads 112 and part of the top surface 104 of the substrate 102. The resulting structure is a base package 122, has a wide flange on the substrate 102 which supports the outer row of the bond pads 112. The base package 122 may be tested prior to further assembly. The testing of the base package 122 verifies the base package 122 to be known good.

With the base package 122 verified as known good, a layer of adhesive 124, such as the die attach material, is applied to the top of the base package 122 and a bare die 126, such as an unpackaged die, is attached thereon. Second bond wires 128 electrically connect the bare die 126 to the outer row of the bond pads 112. A second molding compound 130 is applied to encapsulate the bare die 126, the second bond wires 128 and the outer row of the bond pads 112. The finished package-in-package is then tested to verify that both integrated circuits are known good.

Figure 2:
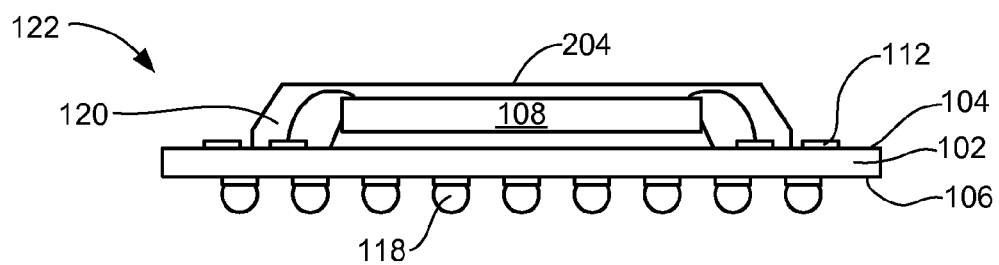
FIG. 2 is a more detailed cross-sectional view of the base package of the integrated circuit package system with laminate base, in an embodiment of the present invention.

Referring now to FIG. 2, therein is shown a more detailed cross-sectional view of the base package 122 of the integrated circuit package system with laminate base 100, in an embodiment of the present invention. The more detailed cross-sectional view depicts the base package 122 ready for the next level of assembly. The integrated circuit 108 may be an ultra thin die in order to facilitate a thin package structure. The substrate 102, having the top surface 104 and the bottom surface 106, supports the integrated circuit 108. The first molding compound 120 has a finished surface 204 above the integrated circuit 108. The outer row of the bond pads 112 is available for connection to other devices, such as circuits (not shown) or other substrates (not shown). The system interconnects 118 are formed on the bottom surface 106 to allow connection to the next level of system (not shown). The pattern of the system interconnects 118 forms a ball grid array (BGA).

Figure 3:
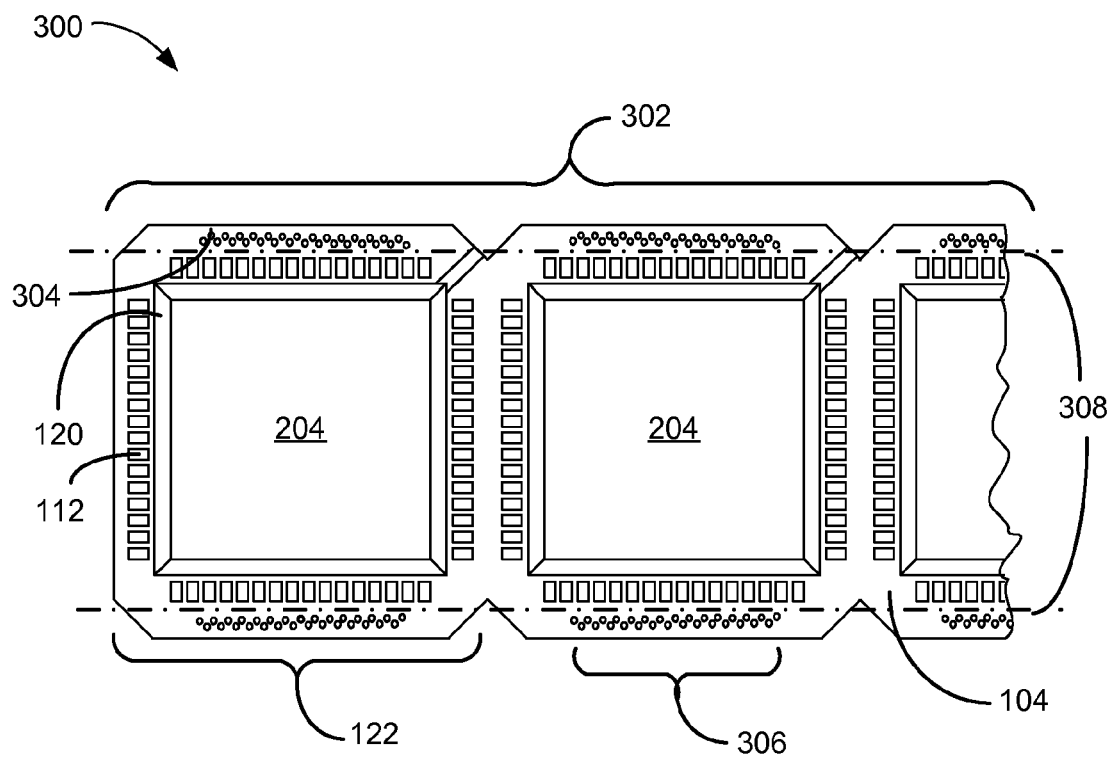
FIG. 3 is a top view of an integrated circuit package system with laminate base, in an embodiment of the present invention.

Referring now to FIG. 3, therein is shown a top view of an integrated circuit package system with laminate base 300, in an embodiment of the present invention. The top view of the integrated circuit package system with laminate base 300 depicts a laminate substrate strip 302 having an array of the bond pads 112, arranged on the top surface 104 around the finished surface 204, and strip test contacts 304 arranged in a non-bondable array at the edges of the laminate substrate strip 302. The strip test contacts 304, located in a staggered array adjacent to the outer row of the bond pads 112, provide an imbedded tester interface 306 for manufacturing testing of each of the base package 122. The close proximity of the strip test contacts 304 to each other allows access by a tester probe (not shown) but the strip test contacts 304 are not suitable for wire bond or solder connection. The laminate substrate strip 302 is a single wide array of the base package 122 prior to singulation. The laminate substrate strip 302 may have any number of the base package 122.

Once the first level of packaging is assembled, the laminate substrate strip 302 is placed in a strip tester (not shown) for analysis of the function in the base package 122. The strip test contacts 304 provide an electrical connection to the base package 122 for test and verification prior to the next level of assembly. In the displayed configuration, singulation lines 308 show that the strip test contacts 304 may be removed prior to final assembly. This method allows complete verification of the function in the base package 122 while providing a smaller package size in the final product.

Figure 4:
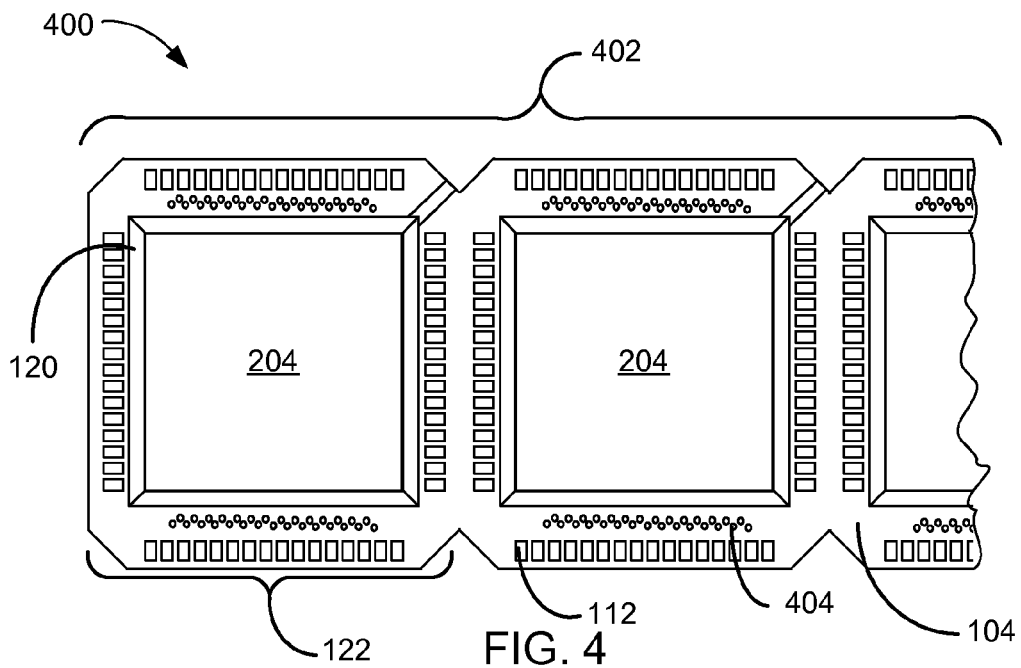
FIG. 4 is a top view of an integrated circuit package system with laminate base, in an embodiment of the present invention.

Referring now to FIG. 4, therein is shown a top view of an integrated circuit package system with laminate base 400, in an embodiment of the present invention. The top view of the integrated circuit package system with laminate base 400 depicts a laminate substrate strip 402 having an array of the bond pad 112 arranged, on the top surface 104, around the finished surface 204, and strip test contacts 404 are arranged in an array at the edges of the laminate substrate strip 402. The strip test contacts 404 are spaced away or not covered by the finished surface 204. The strip test contacts 404 provide an imbedded test probe region for manufacturing testing of each of the base package 122. The laminate substrate strip 402 is a single wide array of the base package 122 prior to singulation. The laminate substrate strip 402 may have any number of the base package 122.

Once the first level of packaging is assembled, the laminate substrate strip 402 is placed in a strip tester (not shown) for analysis of the function in the base package 122. The strip test contacts 404 provide an electrical connection to the base package 122 for test and verification prior to the next level of assembly. In this configuration the strip test contacts 404 remain in the final package.

Figure 5:
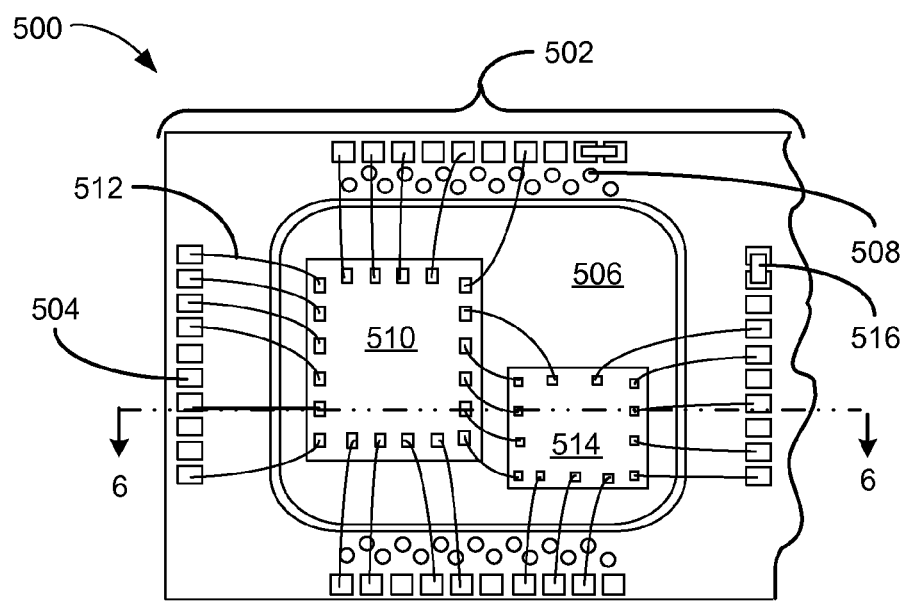
FIG. 5 is a top view of the integrated circuit package system with laminate base having multiple stacked die.

Referring now to FIG. 5, therein is shown a top view of an integrated circuit package system with laminate base 500 having multiple stacked die. The top view of the integrated circuit package system with laminate base 500 depicts a base package 502 with external bond pads 504 arranged on four sides of a molded cover 506. The molded cover 506 is of a material such as a ceramic or an epoxy molding compound. On two of the sides, an array of strip test contacts 508 are aligned between the molded cover 506 and the external bond pads 504. The strip test contacts were used to verify the function of the base package 502 prior to the next level of assembly. A first stacked integrated circuit 510 is mounted on the molded cover 506. Electrical interconnects 512, such as bond wires, couple the first stacked integrated circuit 510 to the external bond pads 504 on the base package 502.

A second stacked integrated circuit 514 is mounted on the molded cover 506, adjacent to the first stacked integrated circuit 510. The electrical interconnects 512 couple the second stacked integrated circuit 514 to the external bond pads 504 and the first stacked integrated circuit 510. A discrete component 516, such as a passive or active component, is mounted on the external bond pads 504. This configuration is suitable for a system-in-package (SIP). A section line 6-6 indicates the view of a cross-section view displayed in FIG. 6.

Figure 6:
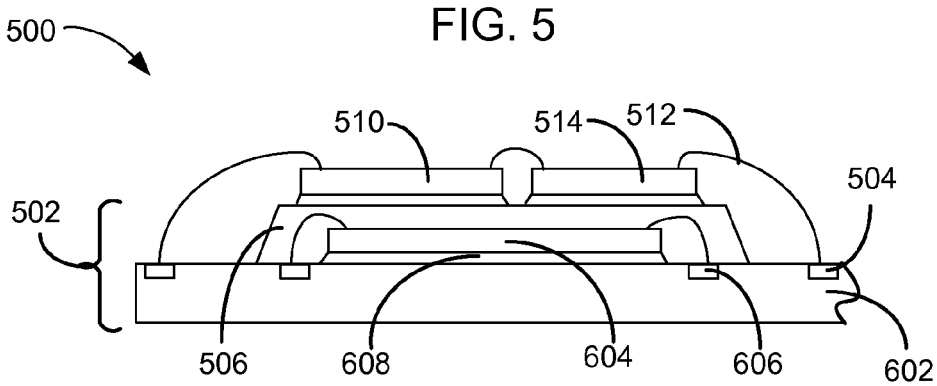
FIG. 6 is a cross-sectional view of the integrated circuit package system with laminate base viewed along the section line 6-6 of FIG. 5, in an embodiment of the present invention.

Referring now to FIG. 6, therein is shown a cross-sectional view of the integrated circuit package system with laminate base 500 viewed along the section line 6-6, of FIG. 5, in an embodiment of the present invention. The cross-sectional view of the integrated circuit package system with laminate base 500 depicts the base package 502 having a laminate substrate 602, the external bond pads 504, the molded cover 506 and an internal integrated circuit 604 that is coupled to an internal bond pad 606 by the electrical interconnects 512. The internal integrated circuit 604 is mounted on the laminate substrate 602 with an adhesive 608, such as a die attach material. The first stacked integrated circuit 510 is mounted on the molded cover 506 with the adhesive 608. The second stacked integrated circuit 514 is mounted on the molded cover 506, with the adhesive 608, adjacent to the first stacked integrated circuit 510. The electrical interconnects 512 couple the first stacked integrated circuit 510 to the second stacked integrated circuit 514 and the external bond pads 504.

Figure 7:
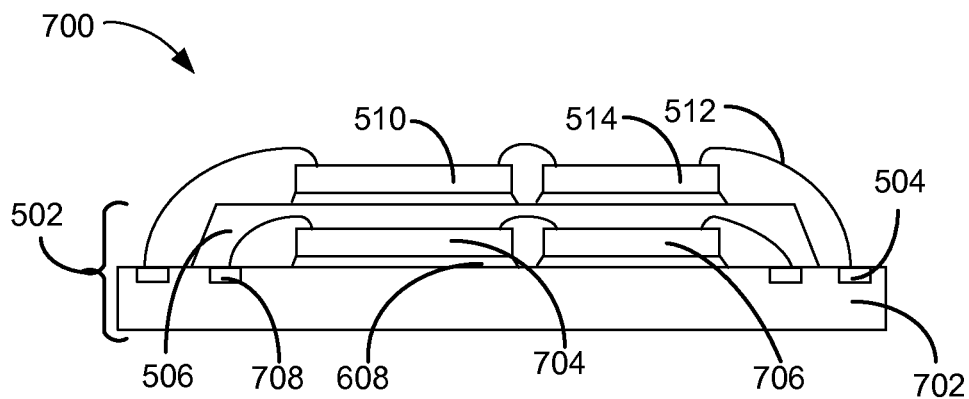
FIG. 7 is a cross-sectional view of the integrated circuit package system with laminate base viewed along the section line 6-6, of FIG. 5, in an alternative embodiment of the present invention.

Referring now to FIG. 7, therein is shown a cross-sectional view of an integrated circuit package system with laminate base 700 viewed along the section line 6-6, of FIG. 5, in an alternative embodiment of the present invention. The cross-sectional view of the integrated circuit package system with laminate base 700 depicts the base package 502 having a laminate substrate 702, the external bond pads 504, the molded cover 506, a first internal integrated circuit 704 and a second internal integrated circuit 706 that is coupled to an internal bond pad 708 by the electrical interconnects 512. The internal integrated circuit 604 is mounted on the laminate substrate 702 with the adhesive 608, such as a die attach material. The first stacked integrated circuit 510 is mounted on the molded cover 506 with the adhesive 608. The second stacked integrated circuit 514 is mounted on the molded cover 506, with the adhesive 608, adjacent to the first stacked integrated circuit 510. The electrical interconnects 512 couple the first stacked integrated circuit 510 to the second stacked integrated circuit 514 and the external bond pads 504. This is an alternative construction of the base package of FIG. 5.

Figure 8:
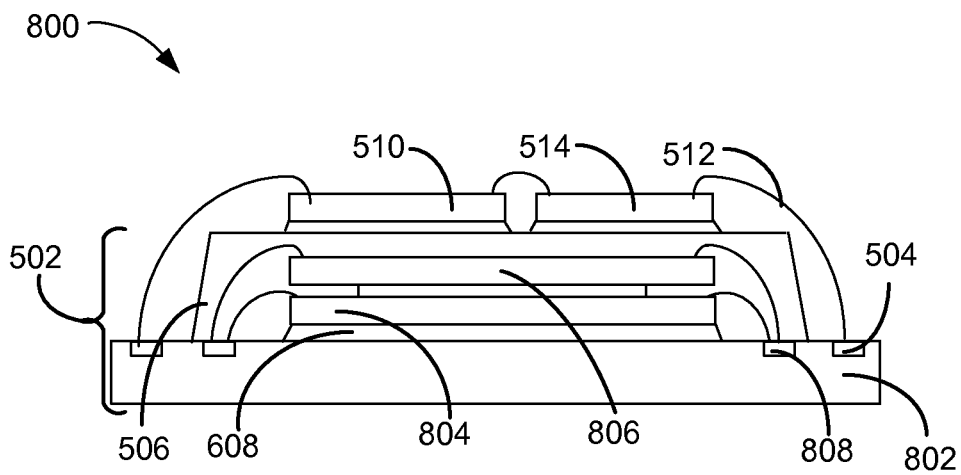
FIG. 8 is a cross-sectional view of the integrated circuit package system with laminate base viewed along the section line 6-6, of FIG. 5, in another alternative embodiment of the present invention.

Referring now to FIG. 8, therein is shown a cross-sectional view of an integrated circuit package system with laminate base 800 viewed along the section line 6-6, of FIG. 5, in another alternative embodiment of the present invention. The cross-sectional view of the integrated circuit package system with laminate base 800 depicts the base package 502 having a laminate substrate 802, the external bond pads 504, the molded cover 506, a first internal integrated circuit 804 and a second internal integrated circuit 806 that is coupled to an internal bond pad 808 by the electrical interconnects 512. The internal integrated circuit 604 is mounted on the laminate substrate 802 with the adhesive 608, such as a die attach material. The first stacked integrated circuit 510 is mounted on the molded cover 506 with the adhesive 608. The second stacked integrated circuit 514 is mounted on the molded cover 506, with the adhesive 608, adjacent to the first stacked integrated circuit 510. The electrical interconnects 512 couple the first stacked integrated circuit 510 to the second stacked integrated circuit 514 and the external bond pads 504. This is another alternative construction of the base package of FIG. 5.

Figure 9:
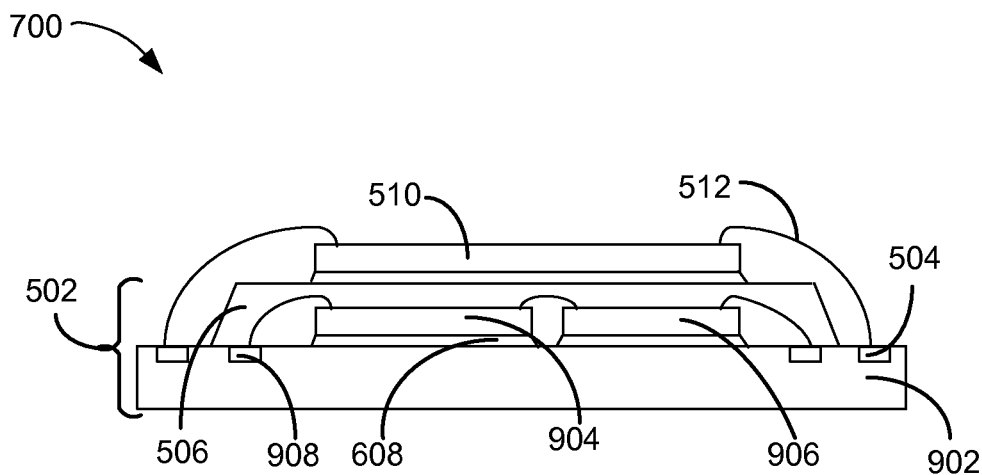
FIG. 9 is a cross-sectional view of the integrated circuit package system with laminate base viewed along the section line 6-6, of FIG. 5, in yet another alternative embodiment of the present invention.

Referring now to FIG. 9, therein is shown a cross-sectional view of an integrated circuit package system with laminate base 900 viewed along the section line 6-6, of FIG. 5, in yet another alternative embodiment of the present invention. The cross-sectional view of the integrated circuit package system with laminate base 900 depicts the base package 502 having a laminate substrate 902, the external bond pads 504, the molded cover 506, a first internal integrated circuit 904 and a second internal integrated circuit 906 that is coupled to the internal bond pad 606 by the electrical interconnects 512. The internal integrated circuit 604 is mounted on the laminate substrate 902 with the adhesive 608, such as a die attach material. The first stacked integrated circuit 510 is mounted on the molded cover 506 with the adhesive 608. The electrical interconnects 512 couple the first stacked integrated circuit 510 to the second stacked integrated circuit 514 and the external bond pads 504. This is yet another alternative construction of the base package of FIG. 5.

Figure 10:
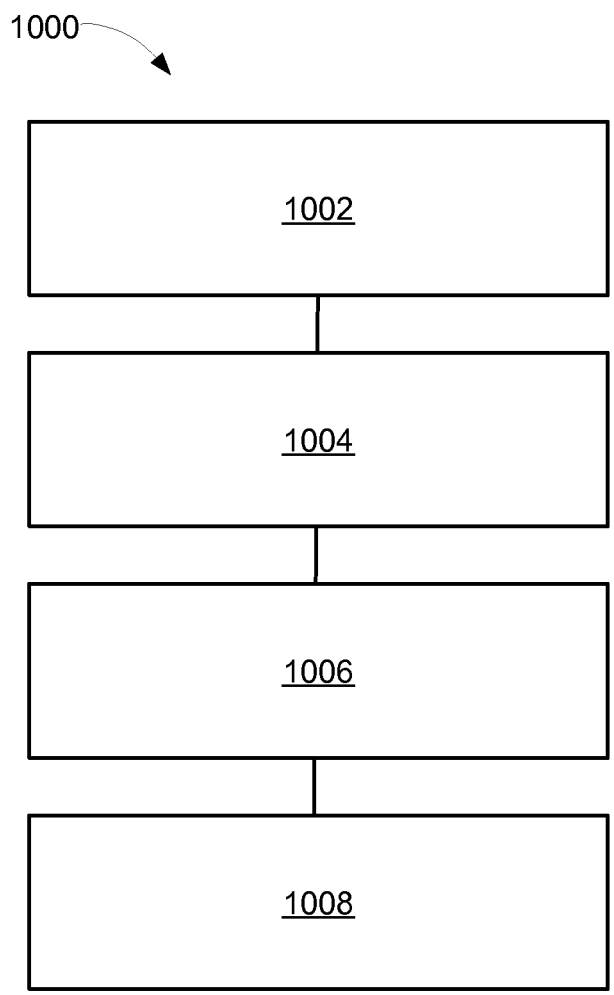
FIG. 10 is a flow chart of an integrated circuit package system with laminate substrate for manufacturing the integrated circuit package system with laminate substrate in an embodiment of the present invention.

Referring now to FIG. 10, therein is shown a flow chart of an integrated circuit package system 1000 for the manufacture of the integrated circuit package system 100, in an embodiment of the present invention. The system 1000 includes forming a base package including, forming a laminate substrate strip, mounting an integrated circuit on the laminate substrate strip, forming a molded cover over the integrated circuit and the laminate substrate strip, and performing a strip test of the base package in a block 1002; attaching a bare die to the base package in a block 1004; connecting electrically the bare die to the laminate substrate strip in a block 1006; and encapsulating the bare die and the base package in a block 1008.

It has been discovered that the present invention thus has numerous aspects.

An aspect is that the present invention provides a method for verifying the base integrated circuit in a multiple integrated circuit stack of system-in-package solution.

Another aspect is the present invention allows multiple integrated circuits to be incorporated in the base package and verified prior to the next level of assembly. The strip testing technique allows multiple base packages to be tested at the same time.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system with laminate base, method and apparatus of the present invention furnish important and heretofore unknown and unavailable solutions, capabilities, and functional aspects for manufacturing package-in-package and system-in-package solutions. The resulting processes and configurations are straightforward, cost-effective, uncomplicated, highly versatile and effective, can be implemented by adapting known technologies, and are thus readily suited for efficiently and economically manufacturing system-in-package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit package system with laminate base comprising:
   a base package including:
      a laminate substrate strip,
      an integrated circuit on the laminate substrate strip,
      a molded cover over the integrated circuit and the laminate substrate strip,
      a strip test contact on a top surface of the laminate substrate strip, the strip test contact spaced away from the molded cover,
      internal bond pads and external bond pads on the laminate substrate strip, the internal bond pads around the integrated circuit, and
      the integrated circuit, part of the laminate substrate strip, and the internal bond pads encapsulated;
   a bare die on the base package, the bare die electrically connected to the laminate substrate strip, wherein the bare die and the base package are encapsulated;
   an adhesive on the molded cover to attach the bare die;
   electrical interconnects couple the bare die to the external bond pads; and
   a system-in-package formed by the base package and the bare die encapsulated.

2. The system as claimed in claim 1 wherein the strip test contact is arranged on an edge of the laminate substrate strip.

3. The system as claimed in claim 1 further comprising a discrete component on the base package including an active component or a passive component mounted on the external bond pads.

4. An integrated circuit package system with laminate base comprising:
   a base package including:
      a laminate substrate strip,
      an integrated circuit on the laminate substrate strip,
      a molded cover over the integrated circuit and the laminate substrate strip,
      a strip test contact on a top surface of the laminate substrate strip, the strip test contact spaced away from the molded cover, wherein the strip test contact on the laminate substrate strip is for an imbedded tester interface to verify the base package;
      internal bond pads and external bond pads on the laminate substrate strip, the internal bond pads around the integrated circuit, and
      the integrated circuit, part of the laminate substrate strip, and the internal bond pads encapsulated;
   a bare die on the base package, the bare die electrically connected to the laminate substrate strip, wherein the bare die and the base package are encapsulated;
   an adhesive on the molded cover to attach the bare die;
   electrical interconnects couple the bare die to the external bond pads; and
   a system-in-package formed by the base package and the bare die encapsulated.

5. The system as claimed in claim 4 wherein the strip test contact is arranged on an edge of the laminate substrate strip.

6. The system as claimed in claim 4 further comprising a discrete component on the base package including an active component or a passive component mounted on the external bond pads.

7. An integrated circuit package system with laminate base comprising:
   a base package including:
      a laminate substrate strip,
      an integrated circuit on the laminate substrate strip,
      a molded cover over the integrated circuit and the laminate substrate strip, wherein the molded cover over the integrated circuit includes a ceramic molding compound or an epoxy molding compound molded to form a mounting surface for a first stacked integrated circuit,
      a strip test contact on a top surface of the laminate substrate strip, the strip test contact spaced away from the molded cover,
      internal bond pads and external bond pads on the laminate substrate strip, the internal bond pads around the integrated circuit, and
      the integrated circuit, part of the laminate substrate strip, and the internal bond pads encapsulated;
   a bare die on the base package, the bare die electrically connected to the laminate substrate strip, wherein the bare die and the base package are encapsulated;
   an adhesive on the molded cover to attach the bare die;
   electrical interconnects couple the bare die to the external bond pads; and
   a system-in-package formed by the base package and the bare die encapsulated.

8. The system as claimed in claim 7 wherein the strip test contact is arranged on an edge of the laminate substrate strip.

9. The system as claimed in claim 7 further comprising a discrete component on the base package including an active component or a passive component mounted on the external bond pads.

* * * * *